United States Patent

Koyama et al.

[11] Patent Number: 5,883,440
[45] Date of Patent: Mar. 16, 1999

[54] OUTLINE FORMING METHOD FOR SEMICONDUCTOR DEVICE AND SEMICONDUCTOR MANUFACTURING DEVICE USED IN THIS METHOD

[75] Inventors: Toshiki Koyama, Kanagawa; Toru Terasaki, Tokyo, both of Japan

[73] Assignee: Sony Corporation, Tokyo, Japan

[21] Appl. No.: 941,301

[22] Filed: Sep. 30, 1997

[30] Foreign Application Priority Data

Sep. 30, 1996 [JP] Japan ..................................... 8-258011

[51] Int. Cl.⁶ ..................................................... H01L 23/28
[52] U.S. Cl. ........................................... 257/787; 257/727
[58] Field of Search .................................. 257/787, 678, 257/727; 438/126, 127

[56] References Cited

U.S. PATENT DOCUMENTS

| | | | |
|---|---|---|---|
| 5,391,923 | 2/1995 | Harada et al | 257/787 |
| 5,555,488 | 9/1996 | McLellan et al. | 257/787 |
| 5,596,277 | 1/1997 | Saito | 257/787 |
| 5,644,169 | 7/1997 | Chun | 257/787 |

FOREIGN PATENT DOCUMENTS 4-1777563  6/1992  Japan ..................................... 257/787

*Primary Examiner*—Mahshid Saadat
*Assistant Examiner*—S. V. Clark
*Attorney, Agent, or Firm*—Hill & Simpson

[57] ABSTRACT

An outline forming method for a semiconductor device, including the steps of placing a film carrier on which a semiconductor chip is mounted in a molding die so as to enclose the semiconductor chip in a cavity defined in the molding die; clamping the film carrier with a clamp of the molding die; injecting a resin to be molded into the cavity; and shearing the film carrier by means of the clamp to separate the film carrier into a part present inside the cavity and a remaining part present outside the cavity. Also disclosed is a semiconductor manufacturing device comprising an upper die; a lower die adapted to be joined to the upper die through a film carrier on which an semiconductor chip is mounted; one of the upper die and the lower die being formed with a cavity recess; a clamp formed around the cavity recess by extending an inner wall of the cavity recess, for clamping a peripheral portion of the film carrier; the other of the upper die and the lower die being formed with a groove for receiving the clamp; and a cutting portion formed at a front end of the clamp for shearing the film carrier along an inner surface of the cavity recess. Accordingly, the sheared end surface of the film carrier is not projected from the outer surface of a molded resin.

4 Claims, 8 Drawing Sheets

F I G. 1
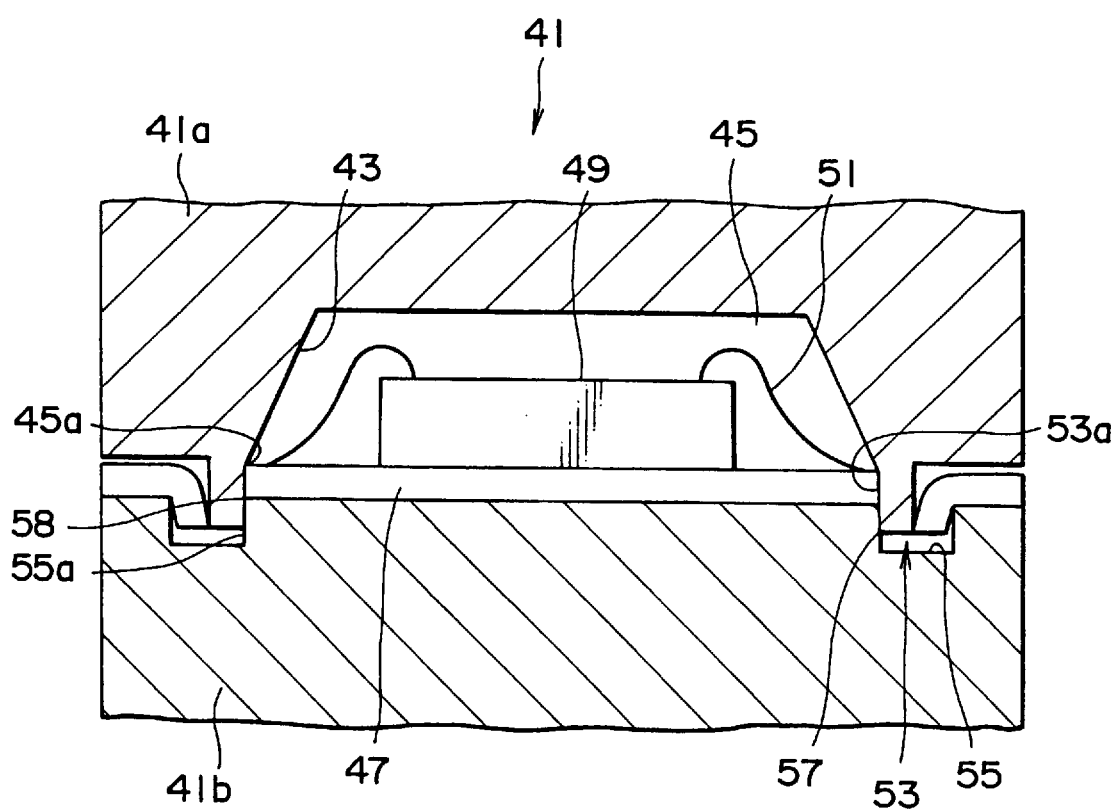

5,883,440

OUTLINE FORMING METHOD FOR SEMICONDUCTOR DEVICE AND SEMICONDUCTOR MANUFACTURING DEVICE USED IN THIS METHOD

BACKGROUND OF THE INVENTION 1. (Field of the Invention)

The present invention relates to an outline forming method for a resin-sealed type semiconductor device using a film carrier and relates also to a semiconductor manufacturing device used in this method.

2. (Description of the Related Art)

Using a tapelike film carrier formed from an organic film is known as one of manufacturing methods for a semiconductor device. A relational manufacturing method for a resin-sealed type semiconductor device using such a film carrier will now be described with reference to FIGS. 9A to 12. The manufacturing method shown is of a BGA (Ball Grid Array) type. FIGS. 9A and 9B are a plan view and a sectional view, respectively, of a film carrier in the related art; FIG. 10 is a sectional view of a molding die in the related art; FIG. 11 is a sectional view of an outline forming die in the related art; and FIG. 12 is a side view showing the shape of a molded package of a semiconductor device manufactured by the related art method.

Referring to FIGS. 9A and 9B, reference numeral 1 generally denotes a film carrier including a tapelike film 2 formed from a polyimide film or a polyester film, a plurality of circuit patterns 3 formed from a copper foil, and an insulating film 5 for insulating a semiconductor chip mounting portion. The circuit patterns 3 are formed on the film 2, and the insulating film 5 is formed on the film 2 so as to cover the circuit patterns 3. The film 2 is formed with a plurality of through holes 7 arranged regularly and exposed to the lower surface of the film 2, so as to take the circuit patterns 3 formed on the upper surface of the film 2 from the lower surface of the film 2 as electrodes.

As shown in FIG. 10, a semiconductor chip 9 is bonded to the semiconductor chip mounting portion of the film carrier 1 by means of a die bonding material (not shown). A plurality of electrode pads formed on the upper surface of the semiconductor chip 9 and a plurality of bonding portions on the circuit patterns 3 are connected through gold wires 11 on a hot heat column (not shown).

In a resin molding step, the film carrier 1 on which the semiconductor chip 9 is mounted is set in a molding die 13 as shown in FIG. 10, and a melted resin 15 to be molded is injected from a gate of the molding die 13 to seal the semiconductor chip 9, the gold wires 11, and the circuit patterns 3 with the resin 15.

The molding die 13 is composed of an upper die 13a and a lower die 13b. The upper die 13a is recessed by electrical discharge machining of a steel material in general to form a cavity 17. A pressure rib (clamp) 19 is formed around the cavity 17 by grinding, so as to prevent leakage of the melted resin 15 from the cavity 17 in injecting the resin 15 into the cavity 17 with the film carrier 1 sandwiched between the upper and lower dies 13a and 13b. To this end, when the film carrier 1 is sandwiched between the upper and lower dies 13a and 13b, the lower end surface of the clamp 19 is set lower in level than the upper surface of the film carrier 1 around the clamp 19 by several micrometers. That is, the film carrier 1 is depressed to be slightly recessed by the clamp 19, thereby preventing leakage of the melted resin 15 from the cavity 17.

After sealing the semiconductor chip 9, the gold wires 11, and the circuit patterns 3 with the resin 15, a plurality of solder ball electrodes 21 are formed at external electrode portions on the back surface of the film carrier 1. Thereafter, the molded package with the film carrier 1 is set in a dedicated outline forming die 23 as shown in FIG. 11 to carry out an outline forming step. The outline forming die 23 is composed of a stripper 25, a die 27, and a cutting punch 29. The film carrier 1 is held by the stripper 25 and the die 27, and a peripheral portion of the film carrier 1 projecting from the outer circumference of the molded package is cut off at a given position by the cutting punch 29, thereby forming the outline of a resin-sealed semiconductor device 31.

In the relational manufacturing method mentioned above, however, it is necessary to ensure a margin for absorbing a dimensional error of the molded part or variations in setting position or ensure a film pressure area 33 (see FIG. 11) in the outline forming step. As a result, the size of the film carrier 1 after cut becomes larger than the size of the molded package by about 0.3 to 0.5 mm as shown in FIG. 12. Thus, the film carrier 1 after cut projects from the outer circumference of the molded package.

Accordingly, when a force F is applied to a projected portion 1a of the film carrier 1 in a measurement or inspection step or during transportation, the film carrier 1 may be separated from the molded package to cause a deterioration in air tightness (especially, moisture resistance) of the package.

Further, in the case that the package is deformed by the application of the force F to the projected portion 1a, the size and shape of the package are changed to cause a difficulty of recognition of the outline of the package at a mounting machine.

SUMMARY OF THE INVENTION

It is accordingly an object of the present invention to provide an outline forming method for a semiconductor device which can prevent the sheared end surface of a film carrier from projecting from the outer surface of a molded resin.

It is another object of the present invention to provide a semiconductor manufacturing device used in the above outline forming method.

It is still another object of the present invention to provide a semiconductor manufacturing device which can prevent separation of a film carrier from a molded resin.

It is a further object of the present invention to provide a semiconductor manufacturing device which can improve the dimensional accuracy of the outline of a molded package.

According to an aspect of the present invention, there is provided an outline forming method for a semiconductor device, comprising the steps of placing a film carrier on which a semiconductor chip is mounted in a molding die so as to enclose said semiconductor chip in a cavity defined in said molding die; clamping said film carrier with a clamp of said molding die; injecting a resin to be molded into said cavity; and shearing said film carrier by means of said clamp to separate said film carrier into a part present inside said cavity and a remaining part present outside said cavity.

According to another aspect of the present invention, there is provided a semiconductor manufacturing device comprising an upper die; a lower die adapted to be joined to said upper die through a film carrier on which an semiconductor chip is mounted; one of said upper die and said lower die being formed with a cavity recess; a clamp formed around said cavity recess by extending an inner wall of said cavity recess, for clamping a peripheral portion of said film carrier; the other of said upper die and said lower die being formed with a groove for receiving said clamp; and a cutting portion formed at a front end of said clamp for shearing said film carrier along an inner surface of said cavity recess.

According to a further aspect of the present invention, there is provided a semiconductor manufacturing device comprising an upper die; a lower die adapted to be joined to said upper die through a film carrier on which a semiconductor chip is mounted; one of said upper die and said lower die being formed with a cavity recess; a clamp provided around said cavity recess for clamping a peripheral portion of said film carrier, said clamp being movable relative to said upper and lower dies; and a cutting portion formed at a front end of said clamp for shearing said film carrier along an inner surface of said cavity recess.

According to a still further aspect of the present invention, there is provided a semiconductor manufacturing device comprising a clamp for clamping a peripheral portion of a film carrier on which a semiconductor chip is mounted; an upper die movable relative to said clamp; a lower die adapted to be jointed to said upper die through said film carrier, said lower die being movable relative to said clamp; one of said upper die and said lower die being formed with a cavity recess surrounded by said clamp; and a cutting portion formed at an end of an inner wall of said cavity recess for shearing said film carrier along an inner surface of said cavity recess.

In the outline forming method for the semiconductor device according to the present invention, the film carrier is sheared by the clamp clamping the film carrier, and the cavity is sealed by the clamp. Accordingly, it is possible to obtain a semiconductor device with no projection of the film carrier from the outer circumference of a molded package. Further, an independent outline forming step using a dedicated outline forming die as in the related art can be eliminated.

In the semiconductor manufacturing device according to the present invention, the clamp is formed around the cavity, and the cutting portion is formed at the front end of the clamp. Accordingly, at the same time the film carrier is sheared, the cavity is sealed, and the sheared end surface of the film carrier can be made to coincide with the outer surface of a molded package.

In the semiconductor manufacturing device including the clamp movable relative to the upper and lower dies, the film carrier is sheared by moving the clamp relative to the upper and lower dies after injecting a resin into the cavity, and the sheared end surface of the film carrier can be made to coincide with the outer surface of a molded package.

In the semiconductor manufacturing device including the upper and lower dies movable relative to the clamp, the film carrier is sheared by moving the upper and lower dies relative to the clamp after injecting a resin into the cavity, and the sheared end surface of the film carrier can be made to coincide with the outer surface of a molded package.

As described above, according to the outline forming method for the semiconductor device of the present invention, the film carrier is sheared by the clamp, and the cavity is sealed by the clamp. Accordingly, the sheared end surface of the film carrier can be made to coincide with the inner surface of the cavity, so that the film carrier of the semiconductor device does not project from the outer circumference of the molded package of the semiconductor device. Further, the shearing of the film carrier can be carried out in series with the resin molding step, so that the independent outline forming step as in the related art can be eliminated.

According to the semiconductor manufacturing device of the present invention, the clamp is formed around the cavity and the cutting portion is formed at the front end of the clamp. Accordingly, at the same time the film carrier is sheared by the cutting portion, the cavity can be sealed by the clamp, and the sheared end surface of the film carrier can be made to coincide with the outer surface of the molded package.

According to the semiconductor manufacturing device including the movable clamp, the film carrier can be sheared by moving the clamp after injecting a resin into the cavity, so that the clamping of the film carrier in injecting the resin can be ensured. Further, since the clamp is independent of the upper and lower dies, the clamp can be independently replaced to thereby improve the maintainability.

According to the semiconductor manufacturing device including the movable upper and lower dies, the film carrier can be sheared by moving the upper and lower dies relative to the clamp after injecting a resin into the cavity. Accordingly, the structure of the molding die can be made simple.

Other objects and features of the invention will be more fully understood from the following detailed description and appended claims when taken with the accompanying drawings.

BRIEF DESCRIPTION OF THE DRAWINGS

FIG. 1 is a sectional view showing a first preferred embodiment of the semiconductor manufacturing device according to the present invention;

DETAILED DESCRIPTION OF THE PREFERRED EMBODIMENTS

The outline forming method for the semiconductor device according to the present invention and some preferred embodiments of the semiconductor manufacturing device using this method will now be described in detail with reference to the drawings.

Figure 2:
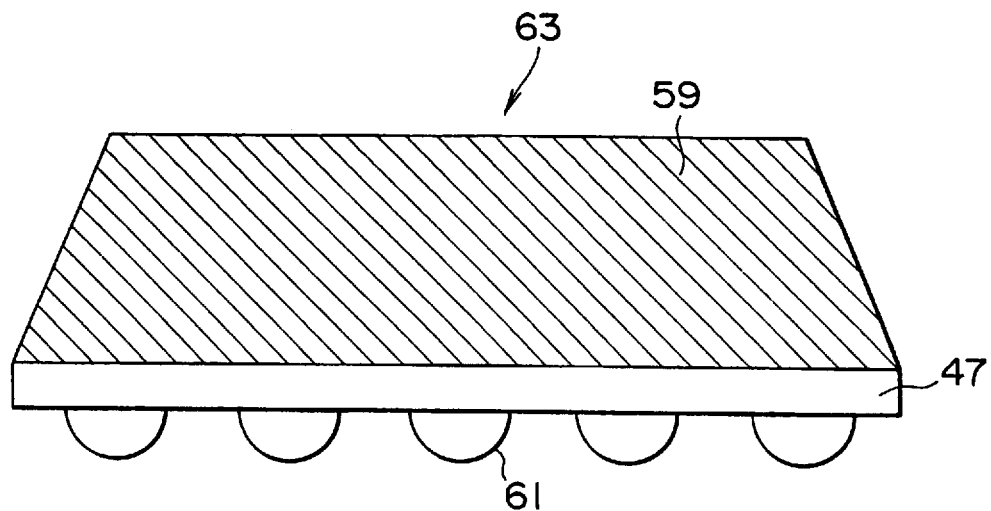
FIG. 2 is a side view of a molded package obtained by an outline forming method using the device shown in FIG. 1.

FIG. 1 is a sectional view showing a first preferred embodiment of the semiconductor manufacturing device according to the present invention, and FIG. 2 is a side view of a molded package obtained by the outline forming method using the device shown in FIG. 1. Referring to FIG. 1, reference numeral 41 generally denotes a molding die as a semiconductor manufacturing device. The molding die 41 is composed of an upper die 41a and a lower die 41b. One of the upper die 41a and the lower die 41b (the upper die 41a in this preferred embodiment) is formed with a cavity recess 43. The cavity recess 43 is combined with the other of the upper die 41a and the lower die 41b (the lower die 41b in this preferred embodiment) to define a cavity 45.

A film carrier 47 is adapted to be sandwiched between the upper die 41a and the lower die 41b of the molding die 41 in the condition that a semiconductor chip 49, wiring patterns, and gold wires 51 are enclosed in the cavity 45. The upper die 41a is integrally formed with a pressure rib (clamp) 53 for preventing leakage of melted resin injected into the cavity 45. The clamp 53 is formed so as to surround the cavity 45. The lower die 41b is formed with a groove 55 opposed to the clamp 53. When the upper and lower dies 41a and 41b are joined with the film carrier 47 sandwiched therebetween, the groove 55 receives the lower end of the clamp 53.

The clamp 53 has a side surface 53a facing the cavity 45. The side surface 53a of the clamp 53 is adapted to come into close contact with an inner side wall 55a of the groove 55. Accordingly, the cavity 45 is tightly sealed by the close contact of the side surface 53a of the clamp 53 and the inner side wall 55a of the groove 55. A cutting portion 57 is formed at the lower end of the clamp 53 (the lower end of the side surface 53a). In joining the upper and lower dies 41a and 41b, the cutting portion 57 slides on the inner side wall 55a of the groove 55. That is, the cutting portion 57 of the clamp 53 can shear the film carrier 47. The width of the groove 55 is preferably set larger than the thickness of the clamp 53 by at least the thickness of the film carrier 47 as shown in FIG. 1.

The outline forming method for the semiconductor device using the molding die 41 will now be described. First, the film carrier 47 on which the semiconductor chip 49 is mounted is placed on the lower die 41b at a given position. Then, the upper die 41a is pressed on the lower die 41b through the film carrier 47 to force the clamp 53 into the groove 55 and simultaneously shear the film carrier 47 at a given position by means of the cutting portion 57 of the clamp 53. The clamp 53 just having sheared the film carrier 47 comes into close contact with the inner side surface 55a of the groove 55, thereby tightly sealing the cavity 45.

Thereafter, melted resin to be molded is injected into the cavity 45 from a gate (not shown) of the molding die 41 to seal the semiconductor chip 49, the wiring patterns, and the gold wires 51 with the resin. After curing the resin, a molded package 59 formed into the shape of the cavity 45 is taken out of the molding die 41, and a plurality of solder ball electrodes 61 are next formed at external electrode portions on the back surface of the film carrier 47, thereby obtaining a resin-sealed type semiconductor device 63 using the film carrier 47 as shown in FIG. 2.

According to the outline forming method for the semiconductor device mentioned above, at the time the film carrier 47 is clamped, the film carrier 47 is sheared by the clamp 53, and simultaneously the clamp 53 comes into close contact with the inner side surface 55a of the groove 55 of the lower die 41b to thereby tightly seal the cavity 45. Then, the resin to be molded is injected into the cavity 45. Accordingly, a sheared end surface of the film carrier 47 comes into coincidence with the inner surface of the cavity 45. That is, in the semiconductor device 63 as shown in FIG. 2, the film carrier 47 does not project from the outer periphery of the molded package 59.

Further, according to this outline forming method, the shearing of the film carrier 47 can be carried out in series with the molding of the resin. Accordingly, the independent outline forming step using a dedicated outline forming die after molding step as in the related art semiconductor manufacturing method can be eliminated.

Further, according to the molding die 41, the clamp 53 is formed at a portion of the upper die 41a around the cavity 45, and the groove 55 for receiving the clamp 53 is formed in the lower die 41b. Moreover, the clamp 53 has the cutting portion 57 adapted to come into close contact with the inner side wall 55a of the groove 55. Accordingly, at the same time the film carrier 47 is sheared by the cutting portion 57, the cavity 45 can be tightly sealed by the clamp 53 inserted into the groove 55. Furthermore, the sheared end surface of the film carrier 47 can be made to coincide with the inner surface of the cavity 45, that is, to coincide with the outer surface of the molded package 59.

In the case that the film carrier 47 has rigidity to some extent in the outline forming method according to the above preferred embodiment, an edge portion of the film carrier 47 may be pressed by an obtuse portion 45a formed on the inner surface of the cavity 45 (as in the condition of FIG. 1) to hold the film carrier 47 in the cavity 45. In the case that the rigidity of the film carrier 47 is low, an evacuation hole (not shown) may be formed through the lower die 41b to hole the film carrier 47 in the cavity 45. Further, another cutting portion 58 may be formed at the upper end of the inner side wall 55a of the groove 55 to better perform the shearing of the film carrier 47.

Figure 3:
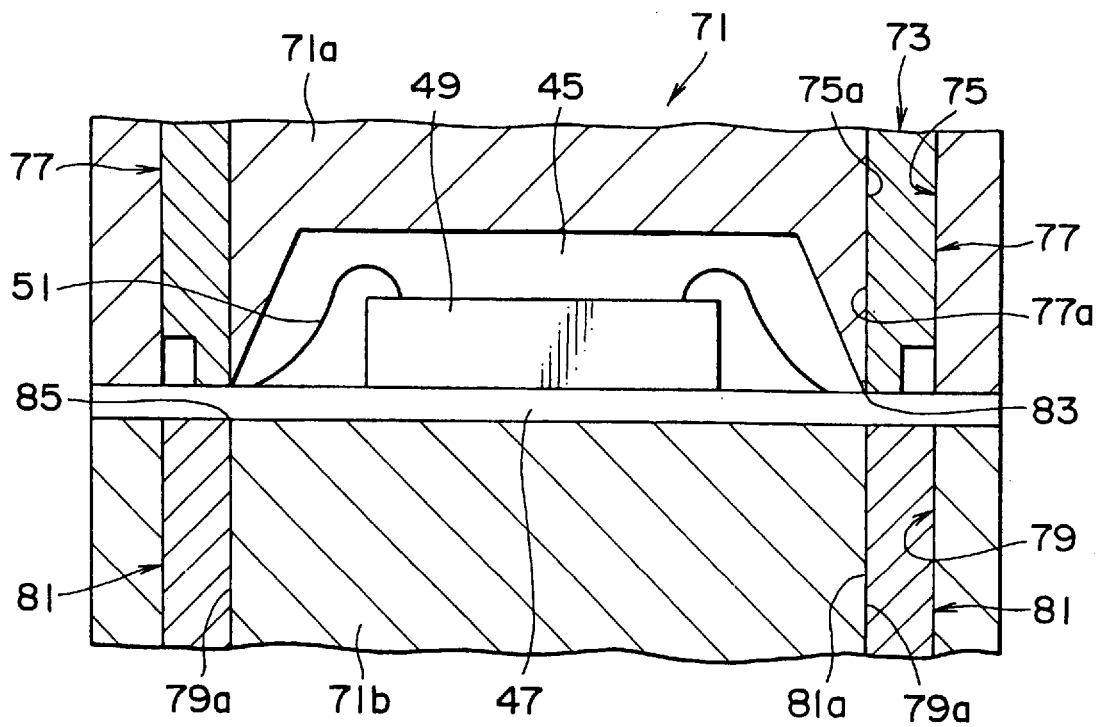
FIG. 3 is a sectional view showing a second preferred embodiment of the semiconductor manufacturing device according to the present invention.
Figure 4:
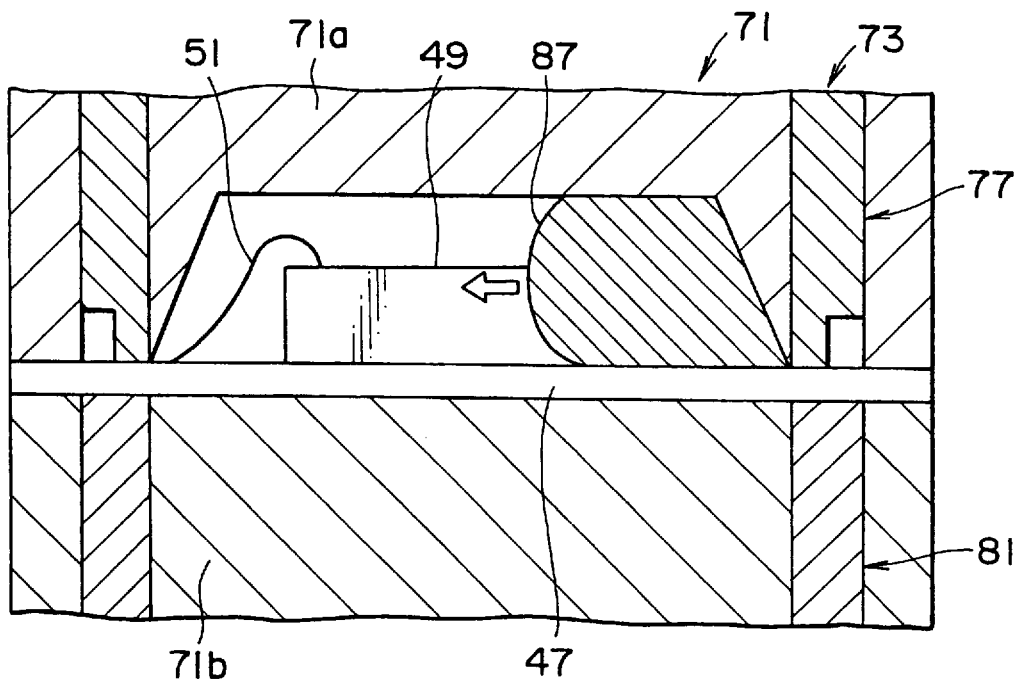
FIG. 4 is a sectional view of the device shown in FIG. 3, showing a step of injecting a resin to be molded.
Figure 5:
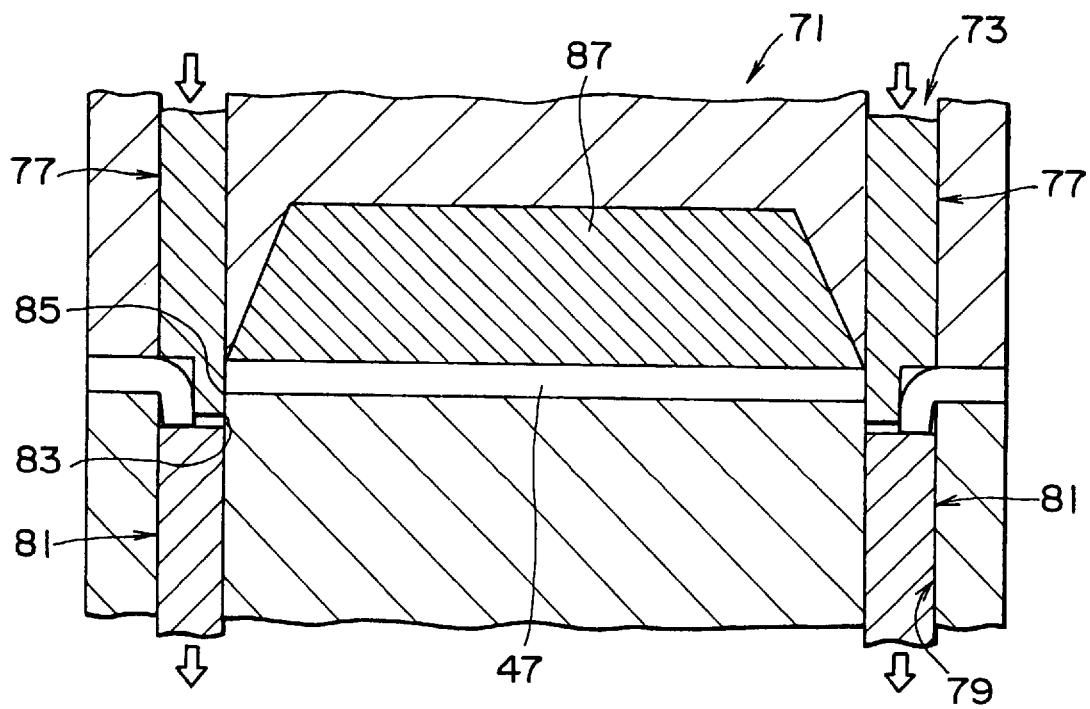
FIG. 5 is a sectional view of the device shown in FIG. 3, showing a step of lowering a clamp.

A second preferred embodiment of the semiconductor manufacturing device (molding die) according to the present invention will now be described with reference to FIGS. 3 to 5. FIG. 3 is a sectional view showing the second preferred embodiment of the semiconductor manufacturing device according to the present invention; FIG. 4 is a sectional view of the device shown in FIG. 3, showing a step of injecting a resin to be molded; and FIG. 5 is a sectional view of the device shown in FIG. 3, showing a step of lowering a clamp. In these figures, the same parts as those shown in FIGS. 1 and 2 are denoted by the same reference numerals, and the description thereof will be omitted herein to avoid repetition.

Referring to FIG. 3, reference numeral 71 generally denotes a molding die, and reference numeral 73 generally denotes a clamp independent of upper and lower dies 71a and 71b of the molding die 71. The molding die 71 is composed of the upper and lower dies 71a and 71b and the clamp 73. The upper die 71a forms a cavity 45 in cooperation with the lower die 71b. The clamp 73 is composed of an upper clamp 77 and a lower clamp 81. The upper die 71a is formed with a vertically extending space 75 (extending in the vertical direction as viewed in FIG. 3) for vertically slidably receiving the upper clamp 77. The space 75 is formed so as to surround the cavity 45. Similarly, the lower die 71b is formed with a vertically extending space 79 for vertically slidably receiving the lower clamp 81. The space 79 is formed so as to be opposed to the space 75. That is, the upper clamp 77 in the space 75 is opposed to the lower clamp 81 in the space 79.

A side surface 77a of the upper clamp 77 on the cavity 45 side is in contact with an inner side wall 75a of the space 75. A cutting portion 83 is formed at the lower end of the side surface 77a. Similarly, a side surface 81a of the lower clamp 81 corresponding to the side surface 77a of the upper clamp 77 is in contact with an inner side wall 79a of the space 79. A cutting portion 85 is formed at the upper end of the inner side wall 79a. When the upper die 71a and the lower die 71b are joined, the upper clamp 77 is lowered to push the lower clamp 81 and enter the space 79.

An outline forming method for a semiconductor device using the molding die 71 will now be described. As shown in FIG. 4, a film carrier 47 on which a semiconductor chip 49 is mounted is placed on the lower die 71b at a given position. Then, the upper and lower dies 71a and 71b are joined with the film carrier 47 sandwiched therebetween and clamped by the upper and lower clamps 77 and 81. When the film carrier 47 is thus clamped by the upper and lower clamps 77 and 81, the lower end surface of the upper clamp 77 is set lower in level than the upper surface of the film carrier 47 around the upper clamp 77 by several micrometers. That is, the film carrier 47 is depressed to be slightly recessed by the upper clamp 77, thereby preventing leakage of melted resin 87.

Thereafter, the melted resin 87 is injected into the cavity 45 from a gate (not shown) of the molding die 71 to seal the semiconductor chip 49, wiring patterns, and gold wires 51 with the resin 87. After filling the cavity 45 with the resin 87, the upper clamp 77 is lowered to push the lower clamp 81 and enter the space 79, thereby shearing the film carrier 47 at a given position by the cutting portions 83 and 85 as shown in FIG. 5.

After curing the resin 87, a molded package 59 formed into the shape of the cavity 45 is taken out of the molding die 71. Then, as shown in FIG. 2, a plurality of solder ball electrodes 61 are formed at external electrode portions on the back surface of the film carrier 47, thus obtaining a resin-sealed type semiconductor device 63 using the film carrier 47.

According to the second preferred embodiment mentioned above, the clamp 73 is provided in the upper and lower dies 71a and 71b so as to be movable (slidable) relative thereto, so that the film carrier 47 can be sheared by the upper clamp 77 for preventing leakage of the melted resin 87. As a result, like the first preferred embodiment, the sheared end surface of the film carrier 47 can be made to coincide with the inner surface of the cavity 45, that is, to coincide with the outer surface of the molded package 59.

Further, the film carrier 47 is clamped by the clamp 73 in injecting the resin 87, and thereafter the film carrier 47 is sheared by moving the clamp 73. Therefore, the clamping of the film carrier 47 in injecting the resin 87 can be ensured.

In addition, since the clamp 73 is separated into the upper and lower clamps 77 and 81 which are independent of the upper and lower dies 71a and 71b, the upper and lower clamps 77 and 81 can be independently replaced, thereby improving the maintainability.

Figure 6:
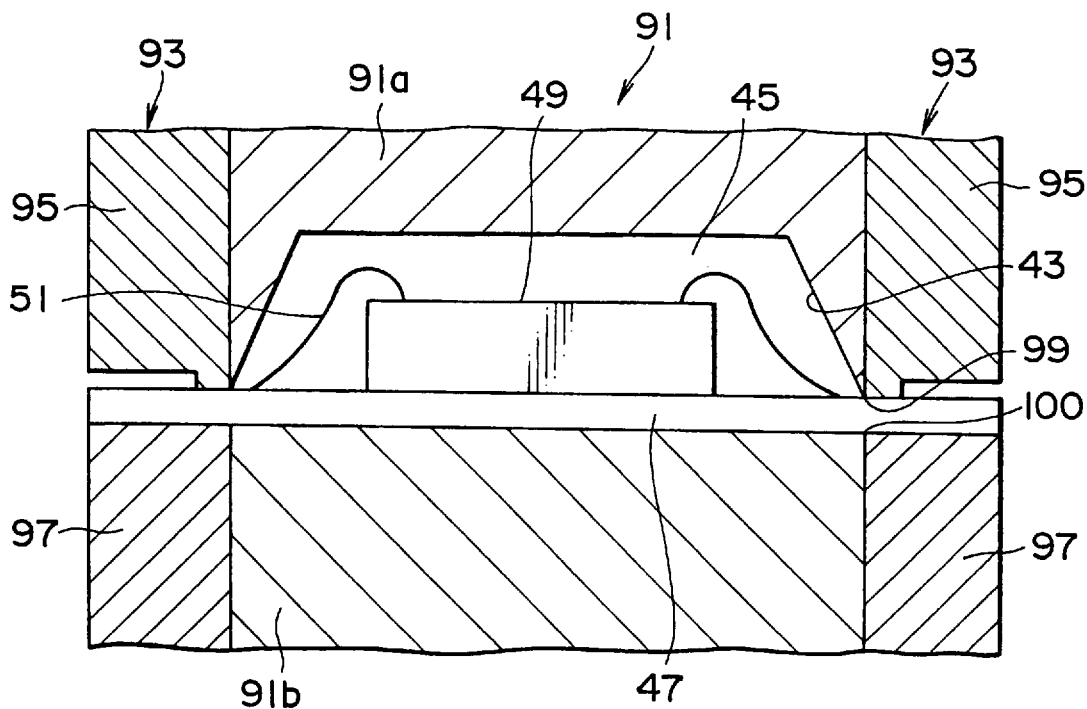
FIG. 6 is a sectional view showing a third preferred embodiment of the semiconductor manufacturing device according to the present invention.
Figure 7:
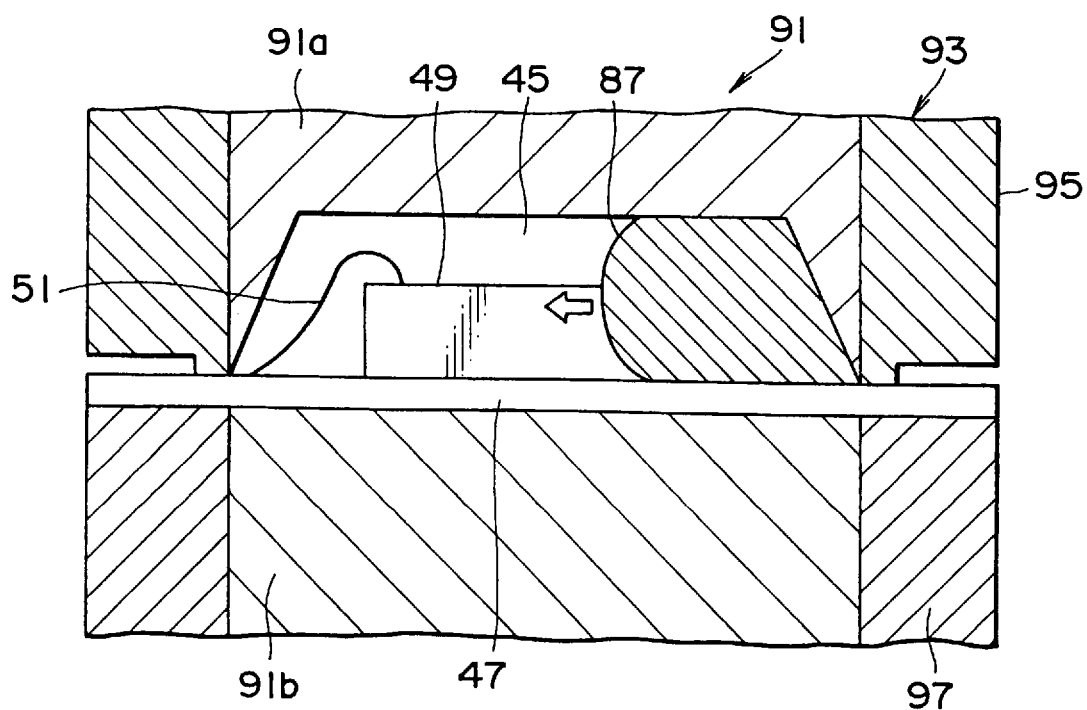
FIG. 7 is a sectional view of the device shown in FIG. 6, showing a step of injecting a resin to be molded.
Figure 8:
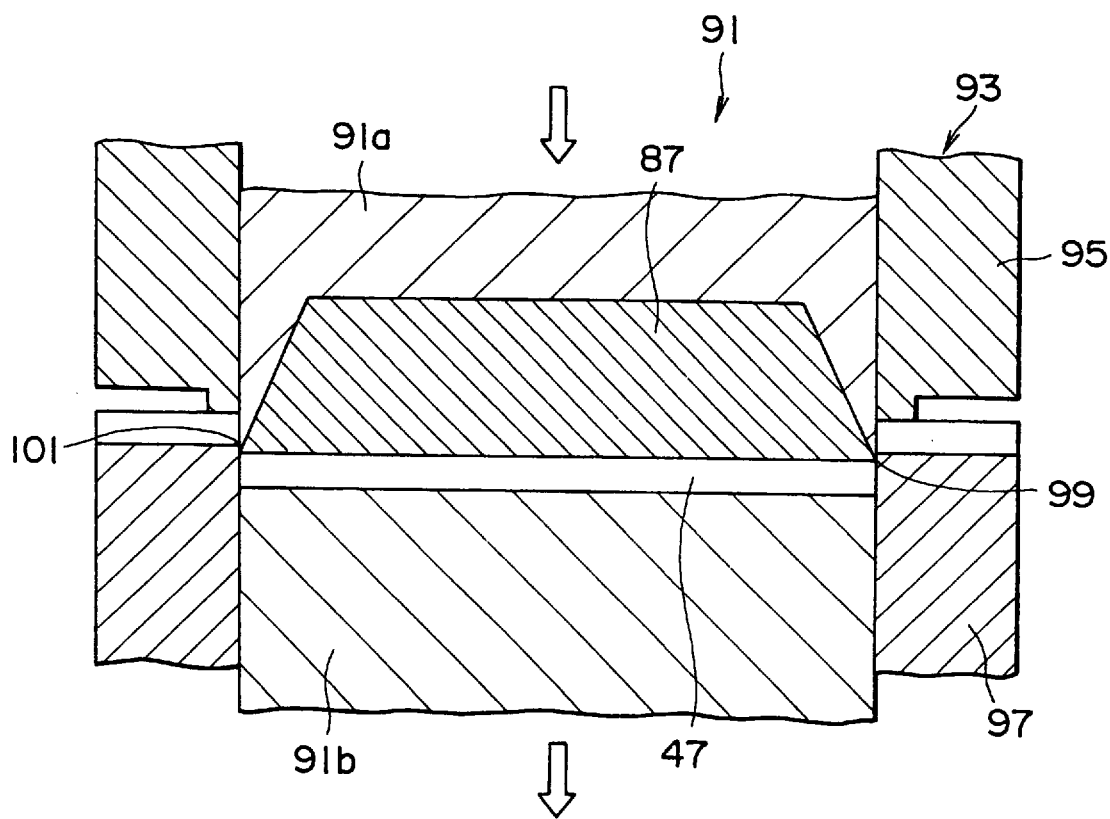
FIG. 8 is a sectional view of the device shown in FIG. 6, showing a step of lowering upper and lower dies.
Figure 9A:
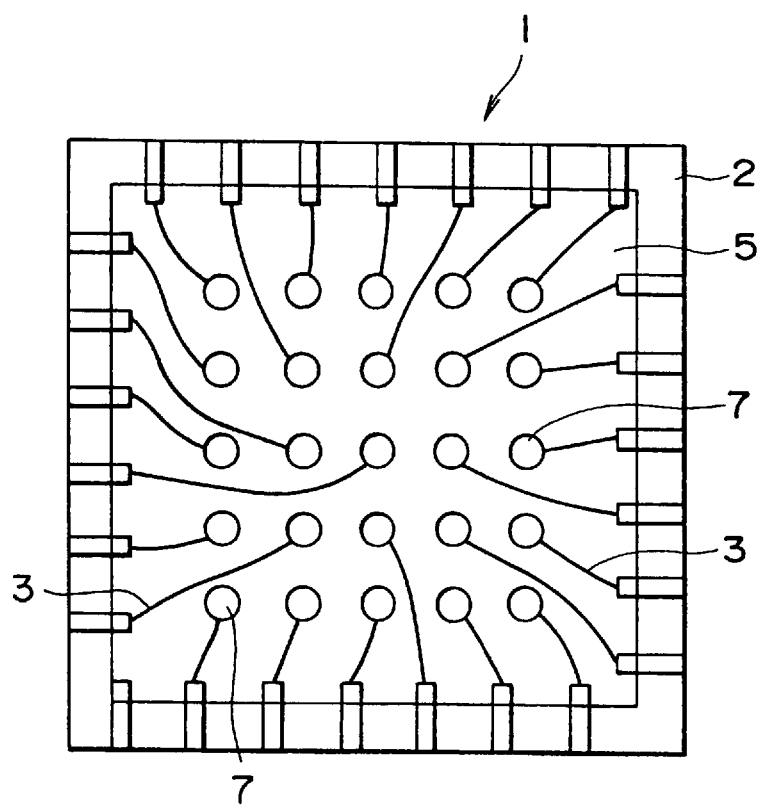
FIGS. 9A and 9B are a plan view and a sectional view, respectively, of a film carrier in the related art.
Figure 9B:
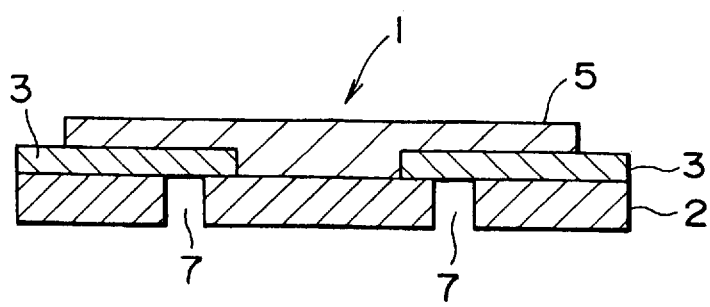
Figure 10:
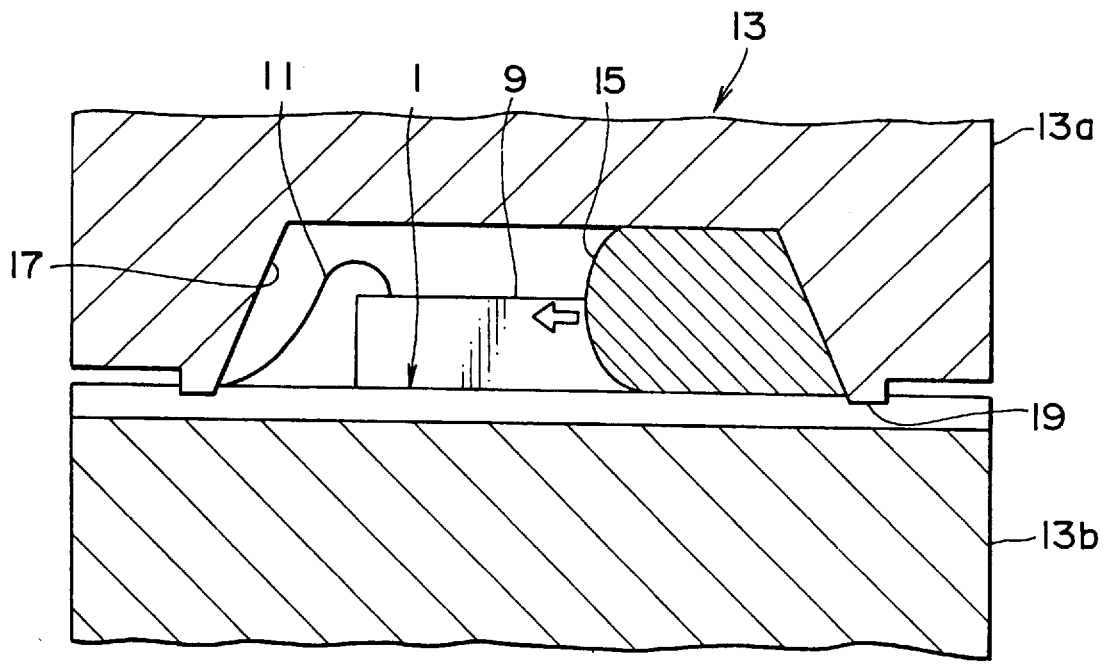
FIG. 10 is a sectional view of a molding die in the related art.
Figure 11:
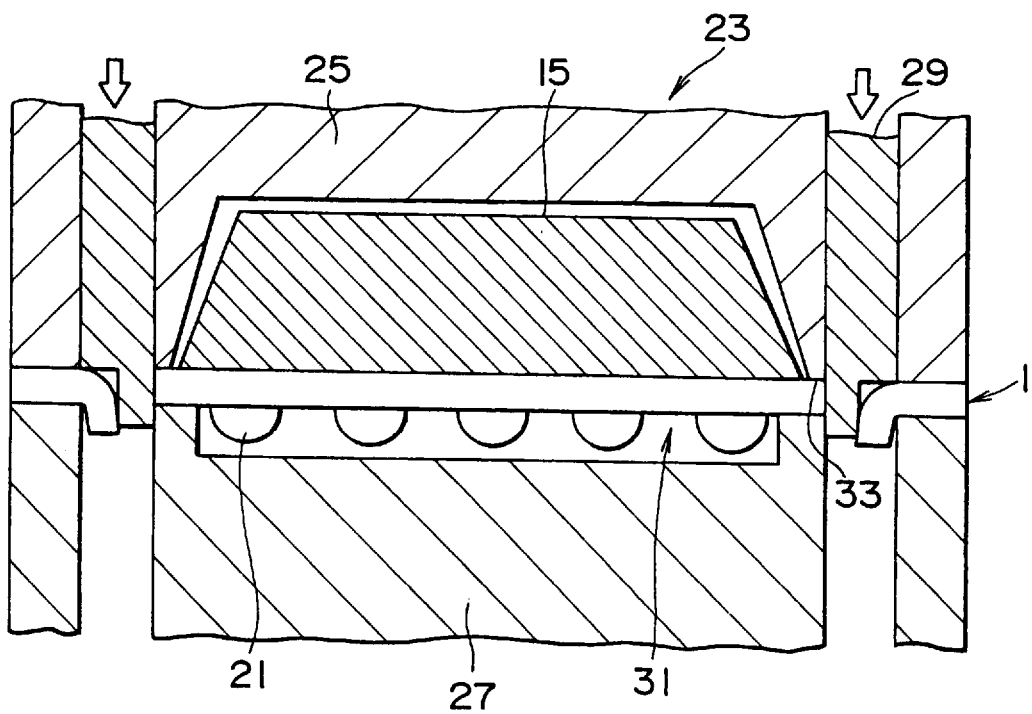
FIG. 11 is a sectional view of an outline forming die in the related art.
Figure 12:
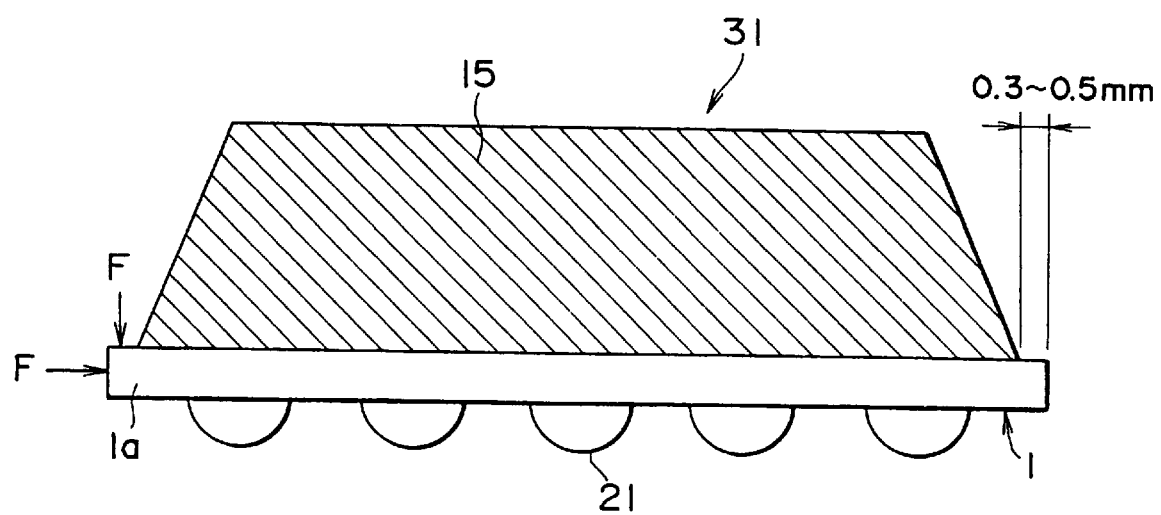
FIG. 12 is a side view showing the shape of a molded package of a semiconductor device manufactured by the related art method.

A third preferred embodiment of the semiconductor manufacturing device (molding die) according to the present invention will now be described with reference to FIGS. 6 to 8. FIG. 6 is a sectional view showing the third preferred embodiment of the semiconductor manufacturing device according to the present invention; FIG. 7 is a sectional view of the device shown in FIG. 6, showing a step of injecting a resin to be molded; and FIG. 8 is a sectional view of the device shown in FIG. 6, showing a step of lowering upper and lower dies. In these figures, the same parts as those shown in FIGS. 1 and 2 are denoted by the same reference numerals, and the description thereof will be omitted herein to avoid repetition.

Referring to FIG. 6, reference numeral 91 generally denotes a molding die composed of upper and lower dies 91a and 91b and a clamp 93. The clamp 93 is composed of upper and lower clamps 95 and 97. The upper and lower dies 91a and 91b are vertically movable relative to the clamp 93. That is, the upper die 91a is vertically slidable on the inside surface of the upper clamp 95, and the lower die 91b is vertically slidable on the inside surface of the lower clamp 97. A cutting portion 99 is formed at the lower end of the sliding contact surface of the upper die 91a, and a cutting portion 101 is formed at the upper end of the inside surface of the lower clamp 97. While it is sufficient that either the upper and lower dies 91a and 91b or the clamp 93 is to be relatively movable, this preferred embodiment is designed so that the clamp 93 is fixed to a die frame, and the upper and lower dies 91a and 91b are movable relative to the clamp 93.

An outline forming method for a semiconductor device using the molding die 91 will now be described. As shown in FIG. 7, a film carrier 47 on which a semiconductor chip 49 is mounted is placed on the lower die 91b at a given position. Then, the upper die 91a is joined to the lower die 91b through the film carrier 47, and the film carrier 47 is clamped by the upper and lower clamps 95 and 97. When the film carrier 47 is thus clamped by the upper and lower clamps 95 and 97, the lower end surface of the upper clamp 95 is set lower in level than the upper surface of the film carrier 47 around the upper clamp 85 by several micrometers. That is, the film carrier 47 is depressed to be slightly recessed by the upper clamp 95, thereby preventing leakage of melted resin 87.

Thereafter, the melted resin 87 is injected into the cavity 45 from a gate (not shown) of the molding die 91 to seal the semiconductor chip 49, wiring patterns, and gold wires 51 with the resin 87. After filling the cavity 45 with the resin 87, the upper and lower dies 91a and 91b are lowered to thereby shear the film carrier 47 at a given position by the cutting portions 99 and 101 as shown in FIG. 8.

After curing the resin 87, a molded package 59 formed into the shape of the cavity 45 is taken out of the molding die 91. Then, as shown in FIG. 2, a plurality of solder ball electrodes 61 are formed at external electrode portions on the back surface of the film carrier 47, thus obtaining a resin-sealed type semiconductor device 63 using the film carrier 47.

According to the third preferred embodiment mentioned above, the upper and lower dies 91a and 91b are movable relative to the upper and lower clamps 95 and 97. Accordingly, by moving the upper and lower dies 91a and 91b relative to the upper and lower clamps 95 and 97 after injecting the resin 87, the film carrier 47 can be sheared. As a result, like the first preferred embodiment, the sheared end surface of the film carrier 47 can be made to coincide with the inner surface of the cavity 45, that is, to coincide with the outer surface of the molded package 59.

Further, the film carrier 47 is clamped by the clamp 93 in injecting the resin 87, and thereafter the film carrier 47 is sheared by moving the upper and lower dies 91a and 91b. Therefore, the clamping of the film carrier 47 in injecting resin 87 can be ensured.

In addition, the molding die 91 can be constructed in a double structure consisting of the upper and lower dies 91a and 91b and the clamp 93. Accordingly, the structure of the molding die can be made simpler than that of the second preferred embodiment adopting a triple structure.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. An outline forming method for a semiconductor device, comprising the steps of:

placing a film carrier on which a semiconductor chip is mounted in a molding die so as to enclose said semiconductor chip in a cavity defined in said molding die;

clamping said film carrier with a clamp of said molding die;

injecting a resin to be molded into said cavity; and shearing said film carrier by means of said clamp to separate said film carrier into a part present inside said cavity with the remaining part cut away.

2. A semiconductor manufacturing device comprising:

an upper mold die;

a lower mold die adapted to be joined to said upper die through a film carrier on which an semiconductor chip is mounted;

one of said upper die and said lower die being formed with a cavity recess;

a clamp formed around said cavity recess by extending an inner wall of said cavity recess, for clamping a peripheral portion of said film carrier;

the other of said upper die and said lower die being formed with a groove for receiving said clamp; and a cutting portion formed at a front end of said clamp for shearing said film carrier along an inner surface of said cavity recess.

3. A semiconductor manufacturing device comprising:

an upper mold die;

a lower mold die adapted to be joined to said upper die through a film carrier on which a semiconductor chip is mounted;

one of said upper die and said lower die being formed with a cavity recess;

a clamp provided around said cavity recess for clamping a peripheral portion of said film carrier, said clamp being movable relative to said upper and lower dies; and a cutting portion formed at a front end of said clamp for shearing said film carrier along an inner surface of said cavity recess.

4. A semiconductor manufacturing device comprising:

a clamp for clamping a peripheral portion of a film carrier on which a semiconductor chip is mounted;

an upper mold die movable relative to said clamp;

a lower mold die adapted to be jointed to said upper die through said film carrier, said lower die being movable relative to said clamp;

one of said upper die and said lower die being formed with a cavity recess surrounded by said clamp; and a cutting portion formed at an end of an inner wall of said cavity recess for shearing said film carrier along an inner surface of said cavity recess.

* * * * *